United States Patent [19]

Buchmann et al.

[11] Patent Number: 5,177,031
[45] Date of Patent: Jan. 5, 1993

[54] METHOD OF PASSIVATING ETCHED MIRROR FACETS OF SEMICONDUCTOR LASER DIODES

[75] Inventors: Peter L. Buchmann, Langnau am Albis; David J. Webb, Ruschlikon; Peter Vettiger, Langnau am Albis, all of Switzerland

[73] Assignee: International Business Machines Corporation, Armonk, N.Y.

[21] Appl. No.: 707,557

[22] Filed: May 30, 1991

[30] Foreign Application Priority Data

Sep. 14, 1990 [EP] European Pat. Off. ........ 90810695.8

[51] Int. Cl.⁵ .................. H01L 33/00; H01L 21/316; H01L 21/318; H01S 3/25
[52] U.S. Cl. ..................................... 437/129; 437/225; 437/235; 437/946; 156/625
[58] Field of Search ............... 437/129, 946, 235, 225; 156/625

[56] References Cited

U.S. PATENT DOCUMENTS 4,751,201 6/1988 Nottenburg et al. .
4,843,037 6/1989 Yablonovitch et al. ............ 437/235
4,871,692 10/1989 Lee et al. ............................ 437/235

FOREIGN PATENT DOCUMENTS 0381521 2/1990 European Pat. Off. .

OTHER PUBLICATIONS

Sin et al., "Surface and Bulk Leakage Currents In Transverse Junction Strip Lasers", J. Appl. Phys., vol. 69, No. 2, Jan. 15, 1991, pp. 1081-1090.
Tamanuki et al., "Ammonium Sulfide Passivation for AlGaAs/GaAs Buried Heterostructure Laser Fabrication Process", Jap. J. Appl. Phys., vol. 30, No. 3, Mar. 1991, pp. 499-500.
Journal of Vacuum Sceince & Technology B 6 (1988) Jul./Aug., No. 4, New York, US Characterization of Photochemically Unpinned GaAs pp. 1180-1183.
Appl. Phys. Lett. 54(3), 16 Jan. 1989 Study of Chemical Surface Passivation Techniques On GaAs pn Junction Solar Cells pp. 213-215.
Japanese Journal of Applied Physics vol. 27, No. 7, Jul., 1988 pp. L1331-L1333 The Effect of $(NH_4)_2S$ Treatment on the Interface Characteristics of GaAs MIS Structures.
European Search No. EP 90 81 0695.

Primary Examiner—Mary Wilczewski

[57] ABSTRACT

A method of passivating etched mirror facets of semiconductor laser diodes which enhances device reliability.

The etched mirror facet is first subjected to a weet-etch process to substantially remove any native oxide as well as any surface layer which may have been mechanically damaged during the preceding mirror etch process. Then, a passivation pre-treatment is applied whereby any residual oxygen is removed and a sub-monolayer is formed which permanently reduces the non-radiative recombination of minority carriers at the mirror facet. Finally, the pre-treated mirror surface is coated with a passivation layer to avoid any environmental effect on the mirror.

8 Claims, 1 Drawing Sheet

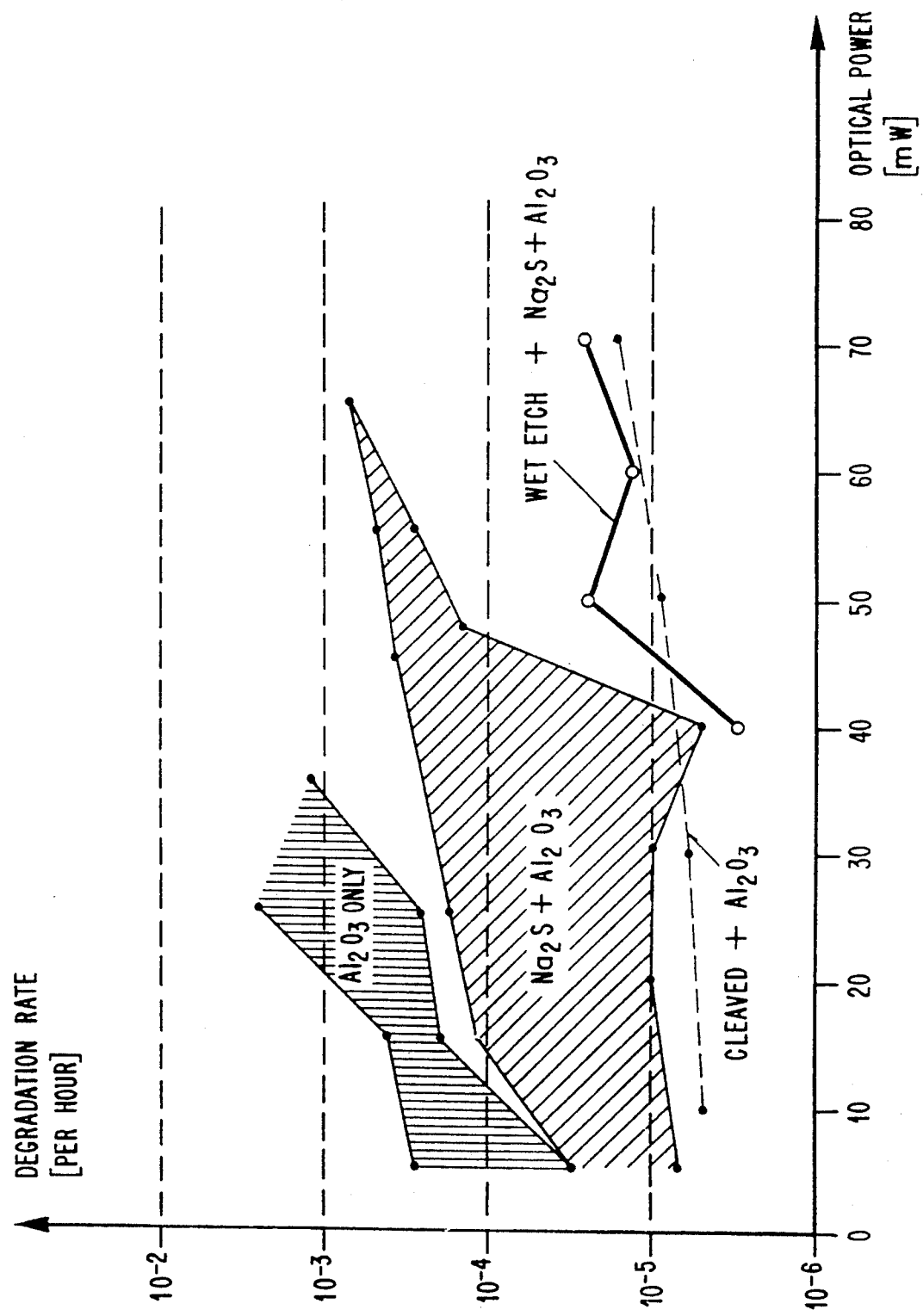

METHOD OF PASSIVATING ETCHED MIRROR FACETS OF SEMICONDUCTOR LASER DIODES

TECHNICAL FIELD

This invention relates to a method for passivating etched mirror facets of semiconductor laser diodes in order to enhance device reliability. This is achieved by reducing the recombination of minority carriers at the mirror interface, thus limiting the development of heat which otherwise causes degradation, particularly at high optical output power.

BACKGROUND OF THE INVENTION

The ever growing importance of III-V compound semiconductor laser diodes in applications such as optical communications, printers and optical disk memory systems has created a high demand for high reliability devices that combine long lifetime with high power capabilities. Usually, maximum optical output power is limited by the catastrophic optical damage (COD) or output power saturation caused by local heating at the laser mirror facets. Thus, it is important that the COD level be raised by optimizing the mirror passivation to reduce heat development near the mirror interface.

Previously, most laser diodes with cleaved mirrors have displayed an excellent performance, high reliability and long lifetime at high optical power, provided that a proper passivation coating is applied to the mirror facets.

More recently, however, much attention has been directed to etched mirror devices mainly because the inherent advantages of this technology allows full wafer processing and testing as well as a high level of integration. A typical device and fabrication method are disclosed in the published European patent application 0 363 647 "Method for Etching Mirror Facets of III-V Semiconductor Structures." However, for etched mirrors it is more difficult to achieve the required reliability and long lifetime at the required output power. Thus, a definite need for improved devices clearly exists.

It has long been recognized that III-V compound surfaces, GaAs being the most widely studied, are generally of poor electronic quality, whereby the use of these materials in optoelectronic applications is limited. Considerable effort has been expended aiming at an improved understanding of the mechanisms that cause mirror heading and performance degradation. Today, it is generally believed that these problems are mainly caused by native oxides at the mirror interface and account for a large number of non-radiative recombination centers which, in turn, cause heating at the mirror facets.

Recently, a passivation method involving a sodium sulfide nonahydride ($Na_2S.9H_2O$) treatment has been found to favorably impact GaAs surface properties, one aspect being the reduction of minority carrier recombination centers. The key step of this method is the removal of native oxides from the semiconductor surface. Once $Ga_2O_3$ and $As_2O_3$ have been dissolved by a highly alkaline sulfide solution, the sulfur neutralizes the surface electronic states that otherwise form efficient recombination centers of minority carriers.

The effects and results of such sulfide treatments have been investigated and discussed in a number of publications:

"Structure and Stability of Passivating Arsenic Sulfide Phases at GaAs Surfaces" by C. J. Sandroff et al. (J. Vac. Sci. Technol. B7 (4), July/August 1989, pp. 841-843). Described are the results of an investigation on the use of aqueous sulfides on GaAs surfaces. The structure and degradation mechanism of the passivating phases formed during treatment with the aqueous sulfide was examined. Degradation was found to occur in the presence of oxygen and light, thereby producing a surface primarily composed of $As_2O_3$. It is shown that long lasting passivation could be achieved if either light or oxygen is excluded.

"Study of Novel Chemical Surface Passivation Techniques on GaAs pn Junction Solar Cells" by M. G. Mauk et al. (Appl. Phys. Lett. 54 (9), 16 January 1989, pp. 213-215) describes GaAs surface passivation techniques wherein passivation is achieved by chemical treatments using $Na_2S$, KOH, $RuCl_3$ and $K_2Se$ aqueous solutions. Solar cell structures are used to evaluate the effectiveness of these passivation techniques.

"Effects of Passivating Ionic Films on the Photoluminescence Properties of GaAs" by B. J. Skromme et al. (Appl. Phys. Lett 51 (24), 14 Dec. 1987, pp. 2022-2024) describes the effects of passivating spin-coated $Na_2S.9H_2O$ on GaAs surfaces. Photoluminescence methods are employed to characterize non-radiative surface recombination. After passivation, the photoluminescence was found to increase, and many of the surface field and surface recombination-related notch features eliminated.

"Raman Scattering Measurements Of Decreased Barrier Heights in GaAs following Surface Chemical Passivation" by L. A. Farrow et al. (Appl. Phys. Lett. 51 (23), 7 Dec. 1987, pp. 1931 ff) discusses Raman scattering to provide a quantitative, contactless way of measuring the reduced barrier height associated with decreased density of GaAs surface states obtained by treating GaAs surfaces with thin films of sodium sulfide nonahydride ($Na_2S.9H_2O$)

The applicant is not aware of any publication disclosing or suggesting the application of such pre-passivation treatment in the fabrication of etched mirrors to improve laser reliability in view of the need for improved mirror facets, which has long been recognized.

As will be hereinafter described, the use of a pre-passivation treatment proceeded by a wet-etch "cleaning" process and followed by a deposition of a final passivation coating effectively prevents any chemical reaction at the mirror facet, providing the etched mirror laser devices with an unexpected high lifetime at optical powers not previously achieved.

SUMMARY OF THE INVENTION

Accordingly, it is an object of the invention to provide a method of fabrication of etched mirror laser diodes that results in devices of improved reliability and long lifetimes at high optical output powers.

Another object is to provide a method of passivating etched mirror interfaces that effectively removes detrimental native oxides and reduces non-radiative minority carrier recombination at the mirror interfaces, providing, additionally, a chemically stable passivation layer that prevents the diffusion of elements capable of reacting with the mirror surface over the lifetime of the device.

It is yet another object to subject the etched mirror facet of a semiconductor laser diode to a wet-etch process to substantially remove native oxides and surface layers which may have been mechanically damaged during the preceding mirror etch processes. A passivation pre-treatment is applied, whereby any residual surface oxide is removed and, a sub-monolayer is formed which permanently reduces the non-radiative recombination of minority carriers at the mirror facet. Finally, the pre-treated mirror surface is coated with a passivation layer to avoid damage to the mirror.

Significant advantages of the present invention are a substantial reduction if not elimination of many long-term reliability problems of etched mirror lasers, such as: residues, damaged crystals and oxide films removed from mirror facets that cause, in conjunction with the proposed passivation applied, a permanent reduction of recombination centers. This results in substantially less heat at the mirrors thereby increasing the device lifetime and power capabilities.

DESCRIPTION OF THE DRAWING

The invention is described in detail below with reference to a diagram which serves to demonstrate the improvement in laser performance that is achievable when applying the inventive method, wherein the Figure shows the degradation rate of the laser drive current needed to maintain a constant output power, as a function of the output power for various laser types.

DETAILED DESCRIPTION OF THE PREFERRED EMBODIMENT

Before describing an embodiment of the invention in greater detail, problems that generally occur during the fabrication of etched mirror laser diodes will be briefly outlined with reference to devices in GaAs technology.

Mirror etching is usually achieved by reactive-ion-etching (RIE), by reactive-ion-beam-assisted-etching (RIBAE), or by chemically assisted ion-beam-etching (CAIBE). A suitable process has been described in published European Patent Application 0 363 547 which is incorporated by reference herein.

With etched mirrors so manufactured, there are a number of problems that affect the performance of the fabricated devices, particularly with respect to long-term reliability. These problems are dependent on mirror surface conditions which may be affected by:
  crystal damage caused by ion bombardment;
  oxide films resulting from an ashing step used to remove the photoresist mask;
  residues from the etching process, e.g., chlorides; and/or
  surface roughness due to non-ideal etch mask edges.

In addition, there exists a general problem inherent in the manufacture of GaAs devices, since oxygen-exposed GaAs and AlGaAs surfaces display large increases in non-radiative recombination rate at surface recombination centers. This severely limits the performance of the device.

In using the inventive passivation method, the above problems are eliminated or substantially reduced. The method comprises three successive processes that will now be described.

In the preferred embodiment, the preferable starting point is an almost completed layered GaAs/ALGaAs laser structure, e.g., a graded index separate confinement heterostructure (GRINSCH) device with etched mirror facets that define the length of the laser cavity.

This structure may be produced using the method described in the above mentioned European Patent Application 0 363 547, followed by an ashing step to remove the photoresist etch mask.

In a first process step, the mirror facets are subjected to a wet chemical treatment for "cleaning" the mirror surfaces and for removing any surface layer of the semiconductor crystal which may have been mechanically damaged by ion-bombardment during the mirror etch process. The etchant is chosen so as to minimize the etch rate difference of the GaAs/AlGaAs layers as a function of Al concentration, and also to produce a relatively slow, well-controlled etch rate so that approximately 20 nm to 30 nm of material can be removed. Suitable for this purpose is an etchant of $H_2SO_4/H_2O_2/H_2O$ in the proportion 1:8:1000 used at room temperature for about 20 seconds. A possible alternative would be a $Br/CH_3OH$ etchant. The sample is then rinsed in DI-water and dried with nitrogen.

The next step is a passivation pre-treatment applied to remove residual surface oxides which may remain after the wet-etch step, thereby reducing the number of minority carrier recombination centers at the mirror interface. This is done by spinning onto the sample a solution of 1M $Na_2S$ in water (e.g. $Na_2S.9H_2O$). This solution dries forming a crust. The wafer is then baked, typically, at 100° to 250° C. for about 10 to 20 minutes. The crust is then removed with a water rinse for one minute, blown dry with $N_2$ and quickly transferred to a vacuum system where permanent passivation coating is applied to the mirrors by means of vacuum deposition.

The effect of the treatment with the aqueous $Na_2S$ solution is to remove surface oxides and replace them with a sub-monolayer coverage of sulfides. The sulfide bonds are considered to be less efficient non-radiative recombination centers than oxide bonds would be. This reduced non-radiative recombination leads to improved mirror reliability since heating at the mirror facets is reduced.

For the pre-treatment, any aqueous solution other than $Na_2S$ can be used, e.g., a solution of $(NH_4)_2S$.

The benefits derived from terminating the mirror surfaces with the sub-monolayer are temporary unless a permanent passivating layer is applied. Without such passivation, protection would degrade within hours, depending on environmental conditions. To obtain a permanently stable interface, a passivation coating is subsequently applied using any conventional vacuum deposition method. For long-term protection, this coating should consist of a material that does not contain oxygen that could either form native oxides with the semiconductor material or not react altogether with the mirror interface, thereby preventing the diffusion of elements capable of reacting with the mirror surface. $Al_2O_3$ has been found to provide good results, $Si_3N_4$ being a suitable alternative. The passivation coating can also take the form of layers applied so as to modify the interface reflectivity.

Referring now to the Figure, there is shown the life test data for three kinds of etched mirror lasers. Data for passivated cleaved mirror lasers are included for comparison. This data shows how the degradation rate of the drive current needed to maintain a constant output power varies with output power. Low degradation rates are indicative of long device life for an appropriate power output. Preferably, a rate of change in drive current of the order $10^{-6}$ to $10^{-5}$ per hour at high (above 40 mW) output power, for several thousand hours is desrhed. Data is shown for three different etched mirror treatments.

Lasers with dry etched mirrors which have been coated with sputtered $Al_2O_3$ (area marked "$Al_2O_3$ only") rapidly degrade at powers as low as 20 mW and would not be acceptable for most applications. Noticeably better are lasers which have received $Na_2S$ treatment after dry etching before coating ("$Na_2S+Al_2O_3$"). They have lower degradation rates at up to about 40 mW. Lasers which have received both, the wet-etch and the $Na_2S$ treatment after dry mirror etching and before coating are the best of all ("Wet etch+$Na_2S$+$Al_2O_3$"). Data on these lasers are almost comparable to cleaved mirror lasers ("Cleaved+$Al_2O_3$"), displaying low degradation rates at 40 mW and lifetimes of several hundred hours at 60 to 70 mW.

Experiments have shown that at output powers of about 5 mW and below, the quality of the mirror passivation can be quite poor without significantly impacting the degradation rate. However, at powers of about 30 mW and above, the mirrors degrade very rapidly unless correctly passivated.

The data shown for etched mirror lasers produced in accordance with the inventive passivation method represents a distinct improvement in etched mirror technology. This improvement was totally unexpected and that applying the wet-etch process prior to the $Na_2S$ treatment and then coating the mirror interface with a conventional passivation layer would result in such benefits. These improvements allow the desired broader use of etched mirror lasers in important application fields that are currently "reserved" for traditional cleaved mirror devices.

While what is considered to be the preferred embodiments of the invention are herein described, variations and modifications thereof will occur to those skilled in the art. Therefore, it is intended that the appended claims shall be construed to include the preferred embodiments and all such variations and modifications in form and detail that fall within the spirit and scope of the invention.

What is claimed is:

1. A method of passivating etched mirror facets of a semiconductor laser diode, comprising the steps of:
   a) wet-etching the surfaces of etched mirror facets of a semiconductor laser diode so as to substantially remove any surface layer mechanically damaged during prior mirror etch processes;
   b) applying a passivation pre-treatment to remove any residual surface oxides which may remain after the wet etching of and form a sub-monolayer that remains chemically stable during device lifetime, thereby substantially reducing the number of non-radiative minority carrier recombination centers at the etched mirror facets; and
   c) coating the pre-treated mirror facet with a passivation layer that does not react with the interface of the mirror facet, thereby preventing the diffusion of elements capable of reacting with the mirror facet interface.

2. The method of claim 1, wherein in step a) wet etching is done so as to exhibit a minimal etch-rate difference for the semiconductor materials exposed at the mirror facets.

3. The method of claim 2, comprising wet etching by use of $H_2SO_4/H_2P_2/H_2O$ in proportions of 1:8:1000.

4. The method of claim 1, wherein in step b) aqueous $Na_2S$ solution is used as the pre-treatment.

5. The method of claim 1, wherein in step b aqueous $(NH_4)_2S$ solution is used s the pre-treatment.

6. The method of claim 4, wherein the pre-treatment of step b) comprises the steps of:
   b1) spinning the $Na_2S$ solution onto the wet-etched mirror facets of the semiconductor laser diode;
   b2) drying the solution to form a crust;
   b3) baking the semiconductor laser diode at 100° to 250° C.;
   b4) removing the crust of step b2; and
   b5) drying the pre-treated mirror facets.

7. The method of claim 1, wherein in step c) the pre-treated mirror facet is coated with a passivation layer consisting of $Al_2O_3$.

8. The method of claim 1, wherein in step c) the pre-treated mirror facet is coated with a passivation layer consisting of $Si_3N_4$.

* * * * *